United States Patent
Chang et al.

(10) Patent No.: US 8,212,696 B2
(45) Date of Patent: Jul. 3, 2012

(54) CONTEXT-BASED ADAPTIVE BINARY ARITHMETIC CODING (CABAC) DECODING DEVICE AND DECODING METHOD THEREOF

(75) Inventors: Tian-Sheuan Chang, Hsinchu (TW); Yuan-Hsin Liao, Kaohsiung (TW)

(73) Assignee: National Chiao-Tung University, Hsinchu (TW)

( * ) Notice: Subject to any disclaimer, the term of this patent is extended or adjusted under 35 U.S.C. 154(b) by 126 days.

(21) Appl. No.: 12/893,132

(22) Filed: Sep. 29, 2010

(65) Prior Publication Data
US 2011/0285560 A1    Nov. 24, 2011

(30) Foreign Application Priority Data
May 21, 2010 (TW) .............................. 99116225 A

(51) Int. Cl.
*H03M 7/30* (2006.01)
(52) U.S. Cl. ...... 341/107; 341/51; 382/247; 375/240.25
(58) Field of Classification Search .................... 341/51, 341/107; 375/240.25; 382/247
See application file for complete search history.

(56) References Cited

U.S. PATENT DOCUMENTS

| | | | |
|---|---|---|---|
| 7,411,529 B2 | 8/2008 | Park et al. | |
| 2006/0126744 A1* | 6/2006 | Peng et al. | 375/240.25 |
| 2007/0080832 A1* | 4/2007 | Yang et al. | 341/50 |
| 2008/0246637 A1 | 10/2008 | Chen et al. | |
| 2009/0079602 A1* | 3/2009 | Sze et al. | 341/107 |

OTHER PUBLICATIONS

Wei, Yu et al. A High Performance CABAC Decoding Architecture, IEEE Transactions on Consumer Electronics, Nov. 2005, vol. 51, No. 4, pp. 1352-1359.*
Bing Shi et al., Pipelined Architecture Design of H.264/AVC CABAC Real-time Decoding, 4th IEEE International Conference on Circuits and Systems for Communications, ICCSC 2008, May 2008, pp. 492-496.*
Kai-Hsiang Chang et al., A Very High Throughput Fully Hardwired CABAC Decoder, International Symposium on Intelligent Signal Processing and Communication Systems, 2009; ISPACS 2009, Jan. 2009, pp. 200-203.*
Y. Yi and I.C. Park, "High-Speed H.264/AVC CABAC decoding," IEEE Transactions on Circuits and Systems for Video Technology, vol. 17, No. 4, pp. 490-494, Apr. 2007.
P.C. Lin, T.-D. Chuang, and L.-G. Chen, "A branch selection multi-symbol high throughput CABAC decoder architecture for H.264/AVC," in Proceedings of IEEE International Symposium on Circuits and Systems, May 2009, pp. 1-5.

* cited by examiner

*Primary Examiner* — Howard Williams
(74) *Attorney, Agent, or Firm* — Bui Garcia-Zamor; Hung H. Bui, Esq.

(57) ABSTRACT

A context-based adaptive binary arithmetic coding (CABAC) decoding device and a coding method thereof are provided. The device comprises: a context memory address calculator, calculating an address identifying a memory location in a context model memory for storage of a context model in next cycle; a mixed context memory, in which the context model of the context memory address calculator is stored and from which the context model is read; a two-bin context adaptive binary arithmetic decoder, outputting several parameters for updating the range and offset of the context model, based on the context model of the mixed context memory and deciding several bins; and a binary syntax element comparator, judging whether a current binary sequence corresponds to the value of syntax elements, based on the bins so as to select a correct memory address.

7 Claims, 3 Drawing Sheets

CONTEXT-BASED ADAPTIVE BINARY ARITHMETIC CODING (CABAC) DECODING DEVICE AND DECODING METHOD THEREOF

BACKGROUND OF THE INVENTION

1. Field of the Invention

The prevent invention relates to a context-based adaptive binary arithmetic coding (CABAC) decoding device and a decoding method thereof, and particularly, to a context-based adaptive binary arithmetic coding (CABAC) decoding device for increasing a video decoding efficiency and reducing a hardware cost and a decoding method thereof.

2. Description of the Related Art

Yongseok Yi et al. disclosed a "high-speed H.264/AVC CABAC decoding" in Transactions on Circuits and Systems for Video Technology, IEEE, in April 2007 (hereinafter, referred to as Document 1). In Document 1, a decoding speed is enhanced in a pipelining way. However, in a decoding process, a selection of context models must be determined by a latest decoded bin value. To resolve this problem, a decoder needs on standby for two cycles until a previous bin is decoded, and then, performs a decoding procedure for next bin. Therefore, the speed of the decoder described in Document 1 can only reach 0.25 bin per cycle in average.

Pin-Chin Lin et al. disclosed a "branch selection multi-symbol high throughput CABAC decoder architecture for H.264/AVC" in proceedings of IEEE International Symposium on Circuits and Systems, in May, 2009 (hereinafter, referred to as Document 2). In Document 2, the problems of data dependency and memory access conflict in the decoding process are resolved and, all context models are stored in registers. However, since the registers for storing the context models requires a large area, it causes a large amount of hardware cost.

Moreover, in the technology disclosed in U.S. patent application Ser. No. 11/863,973 published on Oct. 9, 2008, two bins can be decoded in one cycle only when specific syntax elements are met. Under other circumstances, only one syntax element can be decoded in one cycle. Therefore, the speed of the decoder can only reach 0.80 bin per cycle in average.

In view of the above prior art disadvantages, the prevent invention provides a context-based adaptive binary arithmetic coding (CABAC) decoding device and a decoding method thereof which increases the decoding speed of the context-based adaptive binary arithmetic (CABAC) decoding device to meet the real-time decoding requirement of HD videos under the consideration of hardware cost.

SUMMARY OF THE INVENTION

One of the main objectives of the present invention is to efficiently reduce the requirement of hardware cost of a context-based adaptive binary arithmetic coding (CABAC) decoding device and increase decoding speed by the regularity of context model use in a context-based adaptive binary arithmetic decoding process, so as to meet the real-time decoding requirement of HD videos.

Another objective of the present invention is to provide a context-based adaptive binary arithmetic coding (CABAC) decoding device, comprising: a context memory address calculator, calculating an address identifying a memory location in a context model memory for storage of a context model in next cycle; a mixed context memory, in which the context model of the context memory address calculator is stored and from which the context model is read; a two-bin context adaptive binary arithmetic decoder, determining a first bin and a second bin, based on the context model of the mixed context memory and outputting several parameters for updating the range and offset of the context model; and a binary syntax element comparator, judging whether a current binary sequence corresponds to the value of syntax elements, based on the bin parameters.

A further objective of the present invention is to provide a decoding method using the above-described context-based adaptive binary arithmetic coding (CABAC) decoding device, comprising: limiting the decoding of the two bin parameters in a single syntax element, so that the indexes of the first bins of all syntax elements are even, and the indexes of the second bins thereof are odd; combining all bins in a significance map including most frequent flag-type syntax elements in a decoding process into a new single syntax element so as to obtain next two indexes of the bins; and selecting a plurality of context models from the mixed context memory, based on the type of syntax elements and the next two indexes of the bins, and transmitting the selected context models to the two-bin context adaptive binary arithmetic decoder to determine a first bin and a second bin.

In the above-described context-based adaptive binary arithmetic coding (CABAC) decoding device and the decoding method thereof, wherein a context model group comprises a plurality of context models, when two of the context models of the context model group are not loaded into the two-bin context adaptive binary arithmetic decoder simultaneously, then the context model group is stored in a static random access memory; when two of the context modes of the context model group are loaded into the two-bin context adaptive binary arithmetic decoder simultaneously, then the context model group is stored in the register.

The present invention has the following technical features and effects:

1. Under the architecture of the two-bin parallel decoding, the two-bin decoding is limited in a single syntax element and different syntax elements are combined, so that bins decoded in the same cycle belong to the same syntax element, and the selection procedure of context models becomes easy and has regularity. Moreover, the context model memory can be thus realized by the combination of memories having different attributes. A hardware cost can be greatly reduced by using the mixed context model memory.

2. As compared to Document 1, the present invention can not only resolve the problem of data dependency, but also decode at most two bins simultaneously at each cycle, by calculating all possibly used context models in advance, 3. As compared to Document 1 and Document 3, the decoding speed of the present invention can reach 1.83 bins each cycle in average.

4. As compared to the context model memory totally constructed by registers, disclosed in Document 2, the mixed context model memory used in the present invention can greatly reduce a hardware cost.

5. As to the calculation of the two-bin binary arithmetic decoding, the present invention provide an efficient transformation scheme to resolve the problem of the prior art critical path delay.

In order to make the above and other objectives, features and advantages of the present invention more obvious, preferred embodiments of the prevent invention are exemplarily described in details in cooperation with the accompanying drawings as follows.

DESCRIPTION OF THE PREFERRED EMBODIMENTS

The present invention is not limited to the following description, drawings or explanations made for details of, such as exemplary structures and configurations. The present invention further has other embodiments, and can be effected or carried out in various ways. Furthermore, phrases and terms used in the present invention are illustrative only, but not limitative.

Figure 1:
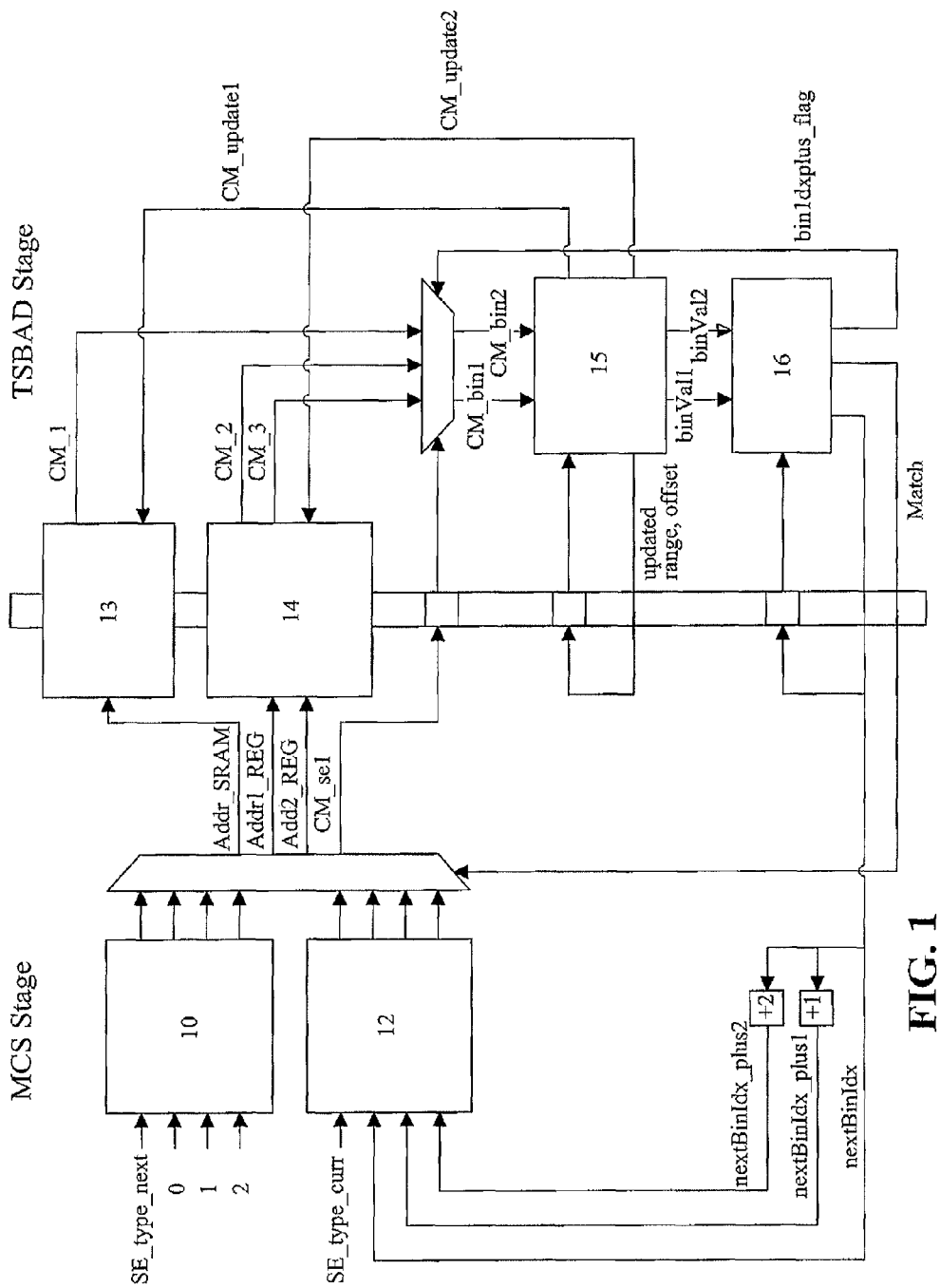
FIG. 1 is a schematic view of a context-based adaptive binary arithmetic coding (CABAC) decoding device of the present invention.

Referring to FIG. 1, a schematic view of an architecture of a context-based adaptive binary arithmetic coding (CABAC) decoding device of the present invention is shown. The context-based adaptive binary arithmetic coding (CABAC) decoding device essentially consists of a context selection unit 10 for next syntax element, a context selection unit 12 for a current syntax element, a context model memory (static random access memory (SRAM)) 13, a context model memory (register) 14, a two-bin binary arithmetic decoding unit 15, and a binarization matching unit 16. Moreover, the operation mode of the context-based adaptive binary arithmetic coding (CABAC) decoding device can be explained by two stages, a context model selection (MCS) stage and a two-bin binary arithmetic decoding (TBBAD) stage, wherein the context model selection (MCS) stage includes the use of the context selection (CS) units 10 and 12 and a context model loading (CL) stage; the two-bin binary arithmetic decoding stage includes the use of a two-bin decoding engine (two-bin binary arithmetic decoding unit) and a context model updating (CU) stage.

As shown in FIG. 1, the context model selection stage mainly selects a context model (CM) which is used for decoding next two bins. In order to simplify and regularize the context model selection stage (MCS), the present invention limits a two-bin decoding in a single syntax element so that the indexes (binIdx) of the first bins of all the syntax elements are even, and the indexes of the second bins thereof are odd. Therefore, the configuration of the context model for next two bins is regular, and the calculation of context model address becomes easier.

To avoid the reduction of feasibility caused by a large amount of flag-type syntax elements (only having a single bin) during decoding, the present invention combines all bins of a significance map consisting of most frequent flag-type syntax elements in the decoding process into a single syntax element. For two sequential bins, in the case that the index of the first bin is ascertained, the index of the second bin can only have two possibilities. This represents that there are only two possible context models. Therefore, in the present embodiment, only three possibly used context models needs to be prepared at the MCS stage, so that the problem of data dependency can be resolved.

After the combination of syntax elements, the variation and characteristic of the indexes (binIdx) of the bins of the significance map are shown in Table 1, wherein binIdx represents on index of a bin; i represents a scanning position; SIG represents a significant coefficient flag (significant_coeff_flag); and LAST represents a last significant coefficient flag (last_significant_coeff_flag).

TABLE 1

(table of the characteristic of the significance map)

| current flag | bin value | next flag | next binIdx |
|---|---|---|---|
| SIG [i] | 0 | SIG [i + 1] | binIdx + 2 |
| SIG [i] | 1 | LAST [i] | binIdx + 1 |
| LAST [i] | 0 | SIG [i + 1] | binIdx + 1 |
| LAST [i] | 1 | X | X |

It is obviously found from Table 1 that when a current syntax element is a significant coefficient flag (significant_coeff_flag) and its bin value is 0, the next binIdx is equal to binIdx+2. Therefore, the selection and configuration of CM can be determined only by binIdx+2. That is, as long as three context models possibly used for the next cycle are previously calculated, the next two bins can be calculated in the same cycle and any pipeline delay can be prevented.

For two sequential bins, the position of the second bin of the syntax element can be binIdx+1 or binIdx+2. This represents that by giving two CMs, the second bin can be decoded, based on the CM selected by the actual binIdx. Therefore, the present invention uses the two context selection (CS) units 10 and 12 to calculate addresses simultaneously, wherein the one context selection unit 12 is used for a current syntax element, and the other context selection unit 10 is used for the next syntax element. Which one is selected from the context selection units for operation at the context model loading (CL) stage is determined by the output result of the binarization matching (BM) unit 16 which will be described later, as shown in FIG. 1.

Moreover, if a register servers as a memory, it causes a much high hardware cost, and a single dual-port SRAM cannot meet the requirements of loading three CMs and executing a large amount of operations in the same cycle. Therefore, in order to further reduce the hardware cost, it must take the configuration of CMs into consideration.

In a preferred embodiment of the present invention, a method of configuring the CM memory under considering the hardware cost and having a decoding efficiency is provided. Since the two-bin decoding is limited in a single syntax element, CMs can be loaded from different sources and assigned to the two-bin binary arithmetic decoding stage descried later, based on the type of syntax elements and binIdex of next two bins. In the present embodiment, CMs are re-configured by the following way.

For each group of CMs, if it is unnecessary to load in two CMs of each group in TBBAD simultaneously, this group of CMs is stored in the SRAM; otherwise, this group of CMs is stored in the register. For example, three CMs are used to decode a flag transform_size_8×8_flag; and since the flag transform_size_8×8_flag only has a bin and does not use a second bin decoding procedure, only one CM is loaded in each time, so that this CM can be stored in the SRAM according to the above-described principle. Under the above-described configuration, as compared to the architecture all using registers, the present invention can greatly reduce the area of memory.

The organization of the context model (CM) memory can refer to Table 2 and Table 3 showed as follows.

TABLE 2

(content of SRAM)

| Address | Index of CM | Syntax Element |
|---|---|---|
| 0-2 | 0-2 | mb_type (SI) |
| 3-5 | 11-13 | mb_skip_flag (P/SP) |
| 6-8 | 24-26 | mb_skip_flag (B) |
| 9-11- | 70-72 | mb_field_decoding_flag |
| 12-31 | 85-104 | coded_block_flag |
| 32-171 | 166-226, 338-398, 417-425, 451-459 | last_significant_coeff_flag |
| 172-201 | 227-231, 237-241, 247-251, 257-261, 266-270, 426-430 | coeff_abs_level_minus1 (first bin) |
| 202-204 | 399-401 | Transform_size_8 × 8_flag |

TABLE 3

(content of register)

| Address | Index of CM | Syntax Element |
|---|---|---|
| 0-7 | 3-10 | mb_type (J) |
| 8-14 | 14-20 | mb_type (P/SP) |
| 15-17 | 21-23 | sub_mb_type (P/SP) |
| 18-26 | 27-35 | mb_type (B) |
| 27-30 | 36-39 | sub_mb_type (B) |
| 31-44 | 40-53 | Mvd |
| 45-50 | 54-59 | ref_idx |
| 51-54 | 60-63 | mb_qp_delta |
| 55-58 | 64-67 | intra_chroma_pred_mode |
| 59 | 68 | prev_intra_pred_mode_flag |
| 60 | 69 | rem_intra_pred_mode |
| 61-72 | 73-84 | coded_block_pattern |
| 73-224 | 105-165, 277-337, 402-416, 436-450 | Significant_coeff_flag |
| 225-253 | 232-236, 242-246, 252-256, 262-265, 271-275, 431-435 | coeff_abs_level_minus1 (excluding a first bin) |

After obtaining memory addresses, one CM is fetched from the SRAM 13 and two CMs are fetched from the register 14, at the same time. Therefore, as compared to the performance all using registers, the present invention, by using the mixed CM memory, can not only prevent the risk of data caused by CM read-out and write-in, but also obviously reduce the hardware cost.

Figure 2:
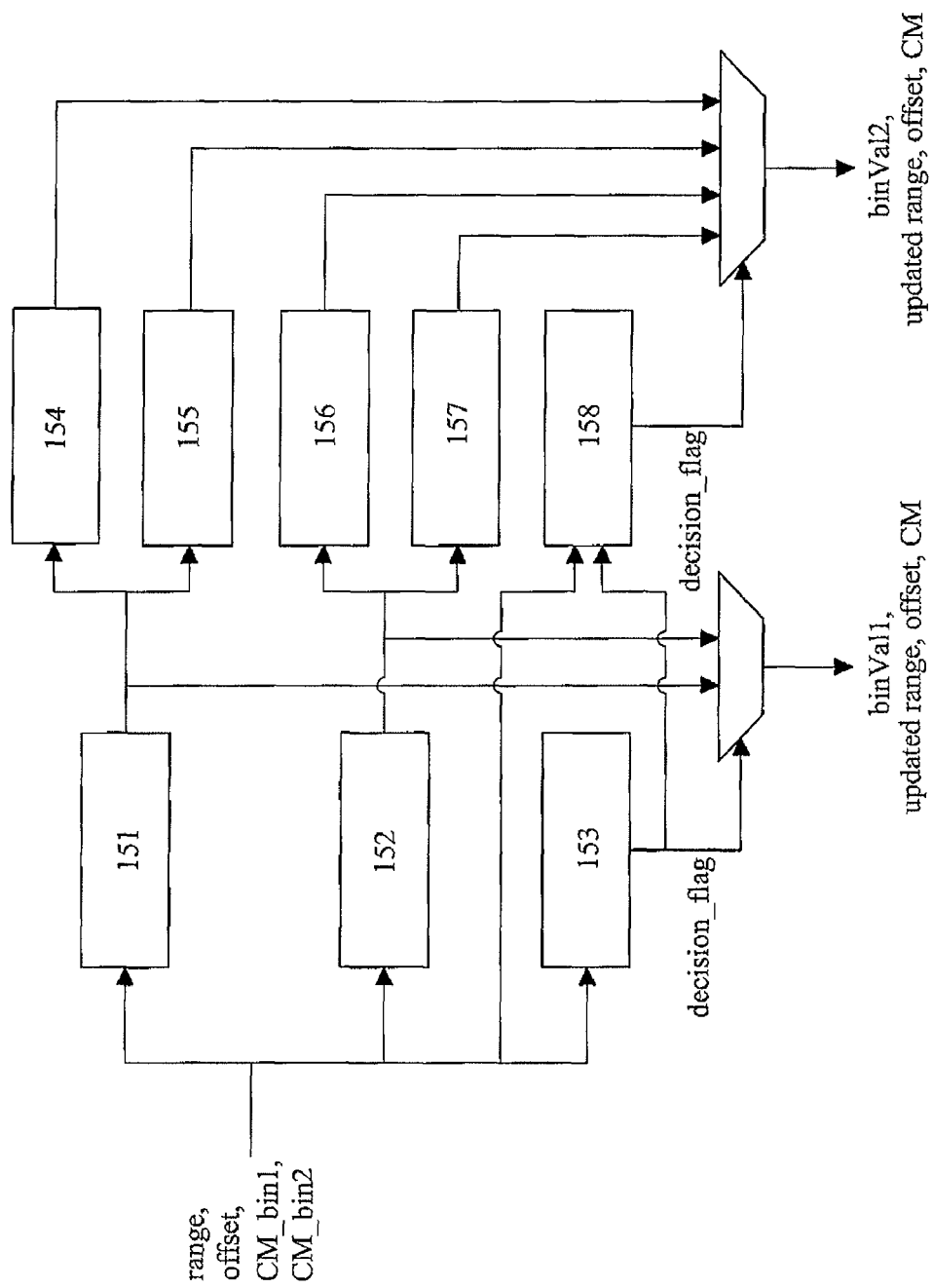
FIG. 2 is a block diagram of a two-bin binary arithmetic decoding (TBBAD) unit of the present invention.

Next, referring to FIG. 2, a block diagram of the two-bin binary arithmetic decoding (TBBAD) unit of the present invention is shown, wherein the two-bin binary arithmetic decoding unit essentially consists of a plurality of maximum possible bin (MPB) decoding units (151, 154, 156), a plurality of minimum possible bin (MPB) decoding units (152, 155, 157), a first bin decision unit 153, and a second bin decision unit 158.

As shown in FIG. 2, a selected context model is transmitted to a two-bin binary arithmetic decoding stage for calculating its bin value. Meanwhile, at this stage, binary matching and the update of context model can be performed. As shown in FIG. 2, the two-bin binary arithmetic decoding unit fetches and outputs two parameters for decoding next bins (binVal1 and binVal2), wherein one of the two parameters is a parameter relating to an updated range, and the other is a parameter relating to an updated offset. The above bin value is mainly determined according to the positive/negative of offsetLPB. Since rangeLPB can be known only through a look-up table, the present invention speeds up the calculation of hardware by re-arranging the flow process of standard formulation (as shown on the left side of FIG. 3), wherein offset (O) and range (R) are represented by the following formula:

$$O_{LPB}=O-R_{MPB}=O(R-R_{LPB})=(O-R)+R_{LPB}.$$

Moreover, the above concept is extended to the decoding of the second bin. When the previous bin is MPB, $$O'_{LPB}=(O_{MPB}-R_{MPB})+R'_{LPB}=(O-R_{MPB})+R'_{LPB}=O_{LPB}+R'_{LPB},$$

or when the previous bin is LPB, $$O'_{LPB}=(O_{LPB}-R_{LPB})+R'_{LPB}=(O-R+R_{LPB}-R_{LPB})+R'_{LPB}=(O-R)+R'_{LPB}.$$

Figure 3:
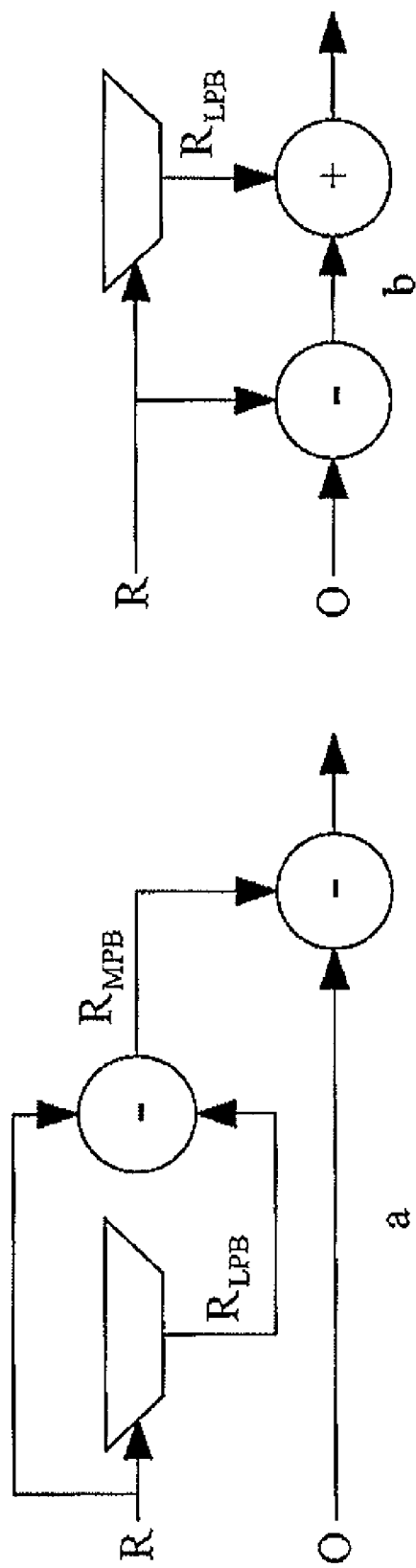
FIG. 3 is a schematic view of a transformation scheme of a two-bin binary arithmetic decoding of the present invention.

It can be found after arrangement, $O_{LPB}$ and $(O-R)$ all are the calculated results for the first bin, as shown on the right side of FIG. 3. Accordingly, all possible decoding paths can be calculated in parallel by the transformation way proposed by the present invention. Then, a correct result is selected by the bin decision units (153, 158). Therefore, critical path delay can be efficiently reduced. As compared to the calculation time (about 3.14 ns) of two BADs (binary arithmetic decoding) which are traditionally and directly connected in series, the present invention (about 2.26 ns) can save about 28% of the calculation time.

Table 4 and Table 5 are respectively shown a plurality of decoding speed based on the present invention at different video sequence and implementation results compared to prior art.

TABLE 4

(decoding efficiency)

| Video Sequence | QP | Bit Rate (Mbps) | Decoding rate (bins/s) | Speed (bins/cycle) |
|---|---|---|---|---|
| Station 2 | 18 | 48.22 | 69901150 | 1.82 |
| Pedestrian_area | 18 | 45.54 | 63493978 | 1.81 |
| Tractor | 18 | 74.47 | 99586800 | 1.83 |
| Riverbed | 12 | 164.0 | 220666642 | 1.85 |
| Sunflower | 12 | 87.84 | 116566675 | 1.83 |
| Rush-hour | 12 | 107.65 | 147268586 | 1.86 |
| Average | | | | 1.83 |

TABLE 5

(implementation results of comparing different designs)

| Specification | Present Invention | Document 2 |
|---|---|---|
| Technology | UMC 90 nm | UMC 90 nm |
| Maximum Frequency | 264 MHz | 222 MHz |
| Number of Gates | 42372 | 82445 |
| Average (number of bins per cycle) | 1.83 | 1.96 |
| Decoding Rate (million bins per second) | 483.1 | 435.1 |

It can be known from the above listed Table 4 and Table 5, as compared to the prior art, the present invention can not only reach a much higher decoding rate (483.1 million bins per second derived from a production of maximum frequency and average speed), but also further save 48.6% [(82445−42372)/82445] of hardware (number of gates) cost.

The preferred embodiments of the present invention are illustrative only. The implementation scope of the present invention is not limited to this. Therefore, any modifications and changes, which are made by the ordinary person skilled in the art according to the claims and specification of the present invention, should all fall within the scope of the present invention.

| LIST OF REFERENCE NUMERALS | |
|---|---|
| 10, 12 | context selection unit |
| 13, 14 | context model memory |
| 15 | two-bin binary arithmetic decoding unit |
| 16 | binary matching unit |
| 151, 154, 156 | MPB decoding unit |
| 152, 155, 157 | LPB decoding unit |
| 153 | first bin decision unit |
| 158 | second bin decision unit |

What is claimed is:

1. A context-based adaptive binary arithmetic coding (CABAC) decoding device, comprising:
   a context memory address calculator arranged to calculate an address identifying a memory location in a context model memory for storage of a context model in a next cycle;
   a mixed context memory to store the context model of the context memory address calculator;
   a two-bin context adaptive binary arithmetic decoder arranged to output a plurality of parameters for updating a range and an offset of the context model based on the context model of the mixed context memory, and to determine a plurality of bins; and
   a binary syntax element comparator arranged to determine whether a current binary sequence corresponds to a value of syntax elements, based on the bins so as to select a correct memory address.

2. The context-based adaptive binary arithmetic coding (CABAC) decoding device as claimed in claim 1, wherein the context memory address calculator includes:
   a first context model selector for calculating a context model address required by a current syntax element at the next cycle; and
   a second context model selector for calculating a context model address required by a next syntax element at the next cycle.

3. The context-based adaptive binary arithmetic coding (CABAC) decoding device as claimed in claim 1, wherein the mixed context memory includes a static random access memory from which a first context model is read and a register from which two second context models are read.

4. The context-based adaptive binary arithmetic coding (CABAC) decoding device as claimed in claim 3, wherein a context model group comprises a plurality of context models, when two of the context models of the context model group are not loaded into the two-bin context adaptive binary arithmetic decoder simultaneously, then the context model group is stored in a static random access memory; when two of the context modes of the context model group are loaded into the two-bin context adaptive binary arithmetic decoder simultaneously, then the context model group is stored in the register.

5. The context-based adaptive binary arithmetic coding (CABAC) decoding device as claimed in claim 1, wherein the two-bin context adaptive binary arithmetic decoder includes: a plurality of maximum possible bin (MPB) decoding units, a plurality of minimum possible bin (LPB) decoding units, a first bin decision unit, and a second bin decision unit.

6. A decoding method for using a context-based adaptive binary arithmetic coding (CABAC) decoding device as claimed in claim 1, the decoding method comprising the steps of:
   limiting decoding of the two bin parameters in a single syntax element, so that an index of a first bin of all syntax elements is even, and an index of a second bins of the all syntax elements is odd;
   combining all bins in a significance map consisting of flag-type syntax elements into a new single syntax element so as to obtain next two indexes of the bins; and
   selecting a plurality of context models from the mixed context memory, based on the type of syntax elements and the next two indexes of the bins, and transmitting selected context models to the two-bin context adaptive binary arithmetic decoder to determine a first bin and a second bin.

7. The decoding method as claimed in claim 6, wherein the bins decoded in the same cycle belong to the same syntax element.

* * * * *